United States Patent [19]
Baldi et al.

[11] Patent Number: 5,231,051
[45] Date of Patent: Jul. 27, 1993

[54] METHOD FOR FORMATION OF CONTACT PLUGS UTILIZING ETCHBACK

[75] Inventors: Livio Baldi, Agrate Brianza; Pietro Erratico, Milan, both of Italy

[73] Assignee: SGS-Thomson Microelectronics s.r.l., Milan, Italy

[21] Appl. No.: 769,600

[22] Filed: Oct. 1, 1991

[30] Foreign Application Priority Data

Oct. 1, 1990 [EP] European Pat. Off. ........ 90830428.0

[51] Int. Cl.⁵ .......................................... H01L 21/44
[52] U.S. Cl. .................. 437/187; 437/192; 156/651
[58] Field of Search .............. 437/187, 192; 156/651

[56] References Cited

U.S. PATENT DOCUMENTS

| | | | |
|---|---|---|---|
| 4,541,169 | 9/1985 | Bartush | 437/187 |
| 4,617,087 | 10/1986 | Iyer et al. | 437/187 |
| 4,804,560 | 2/1989 | Shioya et al. | 437/192 |
| 4,818,334 | 4/1989 | Shwartzman et al. | 156/651 |
| 4,927,783 | 5/1990 | Arai et al. | 437/199 |
| 5,035,768 | 7/1991 | Mu et al. | 437/187 |
| 5,077,236 | 12/1991 | Kim | 437/192 |

OTHER PUBLICATIONS

Paul E. Riley, et al., "Development of a Magnetron--Enhanced Plasma Process for Tungsten Etchback with Response-Surface Methodology", *IEEE Transactions on Semiconductor Manufacturing* vol. 3, No. 3: 142–144, 1990.

Jen-Jiang Lee et al., "A Study of Tungsten Etchback for Contact and Via Fill Application" *IEEE V-MIC Conf.*, Jun. 15–16, 1987, Santa Clara, Calif.; pp. 193–199.

Primary Examiner—Brian E. Hearn
Assistant Examiner—Laura M. Holtzman
Attorney, Agent, or Firm—Seed and Berry

[57] ABSTRACT

An improved planarity when forming contact plugs by a blanket CVD deposition of a metallic matrix layer followed by etchback is achieved by performing a first etchback step to expose the surface of the dielectric material underlying the filling metal layer, while masking the top of the metal plugs with resist caps. The resist caps are formed using a mask derived by field inversion and enlargement from the actual contact mask used for defining the contact areas. With the resist caps covering the contact plugs, the filling metallic material is overetched to eliminate residues along with discontinuities from the planarity of the surface, while shielding the top of the plugs from the overetch. The masked overetch is preferably conducted under conditions of reduced anisotropy and increased selectivity in respect to the first etchback step.

16 Claims, 3 Drawing Sheets

METHOD FOR FORMATION OF CONTACT PLUGS UTILIZING ETCHBACK

FIELD OF THE INVENTION

The present invention relates to the fabrication of high and very high scale of integration semiconductor devices and, more in particular, to an improved process for forming contacts and interconnection vias having micrometric and submicrometric dimensions.

BACKGROUND

Integrated circuits include conductive layers separated by dielectric layers overlaying a semiconductive substrate. It is necessary to provide selected electrical contact from an upper metallic layer to one or more of the conductive layers and regions in the substrate. If proper electrical contact from the metallic layers is not made, the integrated circuit will fail. It is therefore critical to ensure that electrical contact is properly made.

A common technique to make electrical contact to the substrate (or a conductive layer) is to form a hole in the dielectric layer or layers over the substrate, exposing a region in the substrate. A metallic layer is then deposited on the dielectric layer, filling the hole and extending to the substrate to make the electrical contact. This technique provides acceptable electrical contact to the substrate if the hole is sufficiently large in diameter. If the hole width dimensions are too small, the conductive layer will not reach the substrate and electrical contact is not formed between the layers and the substrate. In LSI and VLSI fabrication processes, geometrics and linewidths of 1 $\mu$m or less are used. The formation of electrical contacts with the semiconducting substrate and of the interconnection vias from an upper metallic layer is very difficult because of the extremely small sizes of the contract holes, which they must necessarily assume at such small features.

SUMMARY OF THE INVENTION

According to the principle of invention, a matrix blanket layer of metallic material for filling the holes of contacts and of interconnection vias is chemically deposited from the vapor phase. This layer is sufficiently thick to fill all the contact holes completely with contact plugs making good electrical contact with the substrate. The metal layer is then anisotropically etched back until the tops of the contact plugs are generally even with the adjacent surface of the dielectric layer through which the contact holes for the contacts and interconnection vias had been previously formed. A resist cap is then formed over the plugs. The resist cap completely covers the plugs and overlaps onto the adjacent dielectric layer. The peaks of the metal plugs, which at this point are substantially coplanar with the respectively adjacent surface of the isolation dielectric layer, are now covered by caps of resist capable of effectively masking the peaks of the metal plugs to prevent etching of the plug during a further etching of the metallic material residues that may have been left on the surface of the dielectric layer. The mask for this additional masking step may be derived easily from the mask actually employed for defining the holes of the contacts and/or of the vias through the isolation dielectric layer. The dielectric layer is now subjected to further etching to completely remove, and effectively overetch, all metallic surfaces not covered by the resist cap. According to one embodiment, a different chemical is used for this overetching step than was used to etch the metal layer to the surface of the insulator. The invention is applicable also for fabricating plugs filling contacts between different level metallizations.

The different aspects and advantages of the invention will be more easily understood through the following description and by reference to the drawings.

DETAILED DESCRIPTION OF THE INVENTION

Figure 1:
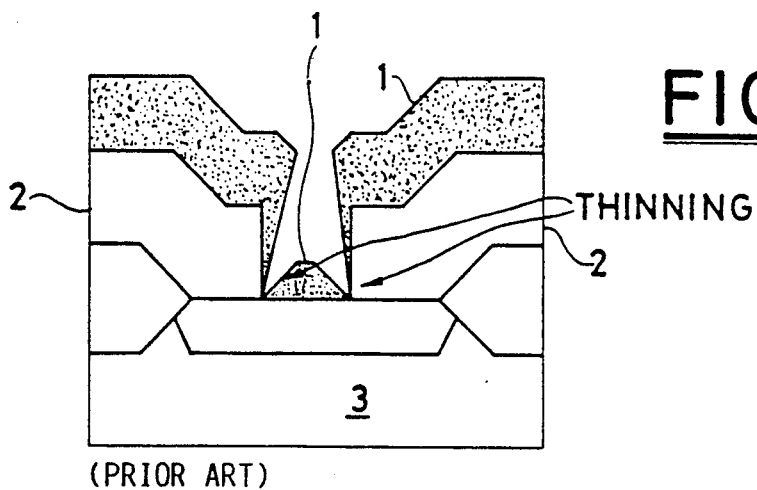
FIG. 1a is a cross-sectional view of problems in the prior art of creating electrical contact to a substrate.

FIG. 1 illustrates the results of using prior art methods of forming contacts with geometries in the submicron range. An insulating layer 2 overlays a semiconductor substrate 3. A contact hole is formed in the insulating layer 2. A conductive layer 1, such as aluminum, is then deposited over the surface of the insulating layer 2 and into the hole. Ideally, the aluminum will fill the hole and form a solid electrical contact. However, with contact holes of submicron geometry, the aluminum does not properly fill the contact hole. The method used for depositing the conductive layer 1 possesses a certain directionality (anisotropy), as in the case of the traditional sputter deposition of aluminum or of an aluminum alloy. Step coverage (i.e. the coverage of the straight side walls of the contact holes) becomes unsatisfactory. Through a self-enhancing shadow effect, the conductive layer 1 within the contact holes may show unacceptable thinnings which may lead in practice to a discontinuity of the electrical path, or alternatively to an excessive current concentration which promotes electromigration of the metal. It is impossible to proportionally reduce the thickness of the isolating dielectric layer 2, i.e. the depth of the contact hole, because such a reduction of thickness would increase the parasitic capacitances between the conductive layer 1 and the semiconducting substrate 3, thus impairing the speed performance of the circuits. An integrated circuit having the thinning shown in FIG. 1 will likely fail. It is therefore necessary to improve the electrical contact between the upper metallic layer and the substrate.

In order to facilitate cross referencing, the same reference number refers to the same parts or equivalents thereof in each figure. Moreover, in order to avoid overburdening the figures with well-known features of the integrated structures, which are not necessary to the illustration of the specific technical problem and proposed solutions thereof, some steps have not described in detail; sufficient detail is provided that a person of ordinary skill in the art can understand and practice the invention.

Figure 2:
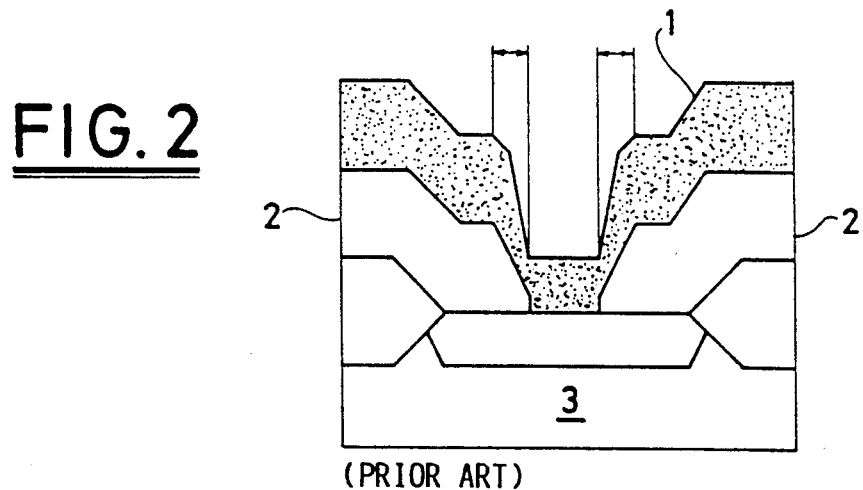
FIG. 2 is a cross-sectional view of one proposed prior art technique which has been proposed to solve the problem of FIG. 1.

FIG. 2 illustrates one commonly adopted prior art solution for the problem, shown in FIG. 1, of not providing electrical contact. The contact holes are formed with tapered walls, i.e. with the side walls of the relative holes diverging toward the opening, in order to avoid forming vertical steps. These tapered holes may be more easily covered by the metal, as schematically shown in FIG. 2. Many techniques have been proposed for making the tapered contact holes, including controlled erosion of the masking resist, modification of the anisotropy conditions during the etching of the dielectric layer 2, and thermal reflow of the dielectric layer 2 by means of high a temperature treatment. All these techniques, beside being intrinsically difficult to control, produce contacts having overall dimensions which are often larger than the minimum geometry in the submicron range and larger than the desired lithographic limit of the process, which creates sacrifice in terms of packing density.

A proposed prior art solution of the problem is based on the use of a metal or conductor other than aluminum which may be deposited by chemical vapor deposition (CVD), a technique which is easily controlled and which is characterized by an excellent isotropy and produces an excellent step coverage. This solution provides complete filling of holes having a high depth-to-width ratio. Suitable metallic materials which may deposited in this way are, as example, tungsten, titanium, alloys of tungsten, alloys of titanium, and titanium nitride. In order to obviate the relatively high resistivity of these materials in respect to that of aluminum, it has been proposed to fill the holes formed through the dielectric layer with one or more of these CVD depositable metallic materials, thus forming a first portion of contact plugs 11 with one or more of these materials. A different, highly conductive, metallic material, such as aluminum is then deposited, to form a conducting layer to these conductive plugs. The aluminum layer is defined by masking and etching in order to create the desired electric connection tracks to the contact plugs 11.

Figure 3:
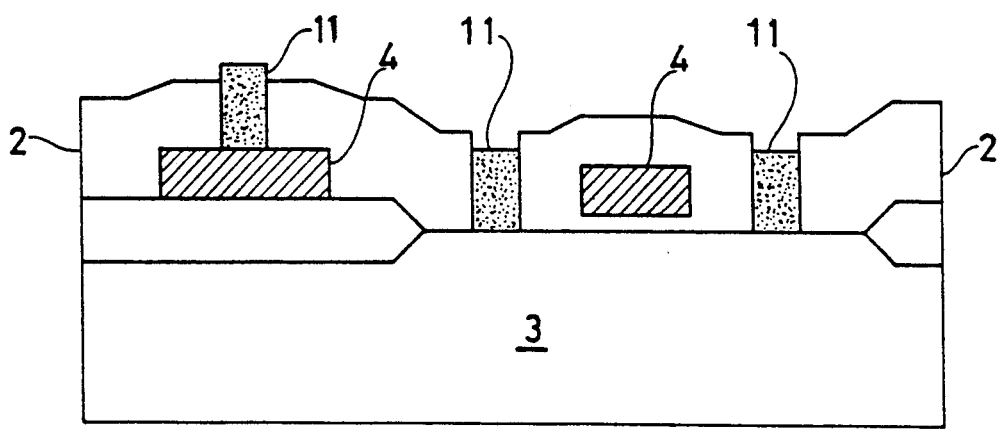
FIG. 3 is a cross-sectional view of another proposed prior art solution of the problem shown in FIG. 1.

As shown in FIG. 3, according to a first known technique, disclosed in the article "SELECTIVE CVD OF TUNGSTEN AND ITS APPLICATIONS TO MOS VLSI" by Takahiko Moriya and Hitoshi Itoh of the VLSI Research Center, Toshiba Corporation, presented at the 1985 Workshop of Material Research Society, tungsten or an equivalent material is deposited under special conditions capable of determining a selective deposition of the metal only on exposed surfaces of the semiconducting substrate and/or of existing metal structures and metallization layers (e.g. on the exposed surface of a doped polycrystalline silicon gate structure or on a first level aluminum metallization layer) and not on surfaces of essentially dielectric layers, to form conductive plugs 11. This technique is extremely sensitive to contaminations of the surfaces which may reduce and vanify deposition selectivity through undesired nucleations of the metallic material also on the surface of the isolation dielectric layer with a consequent growth also in those sites of the metallic deposit. Moreover, as indicated in FIG. 3, the contact areas with the semiconducting substrate 3 and with existing "polysilicon" lines 4, are commonly at different levels. The insulating layer 2 may also have slightly different thickness at different regions on the surface. These differences are reproduced in the height of the plugs 11 at the end of such a selective chemical vapor deposition process of the metallic material. This difference among the levels of the peaks of the plugs 11 in respect to the respectively adjacent surface of the isolation dielectric layer 2 may be difficult to eliminate and creates remarkable problems to the subsequent formation of the interconnecting metal tracks. An analogous problem is faced when, with the same technology, contact plugs 11 are grown on a first metallization level, for filling the contact holes between said first level and a second metallization level (commonly referred to as vias).

Figure 4A:
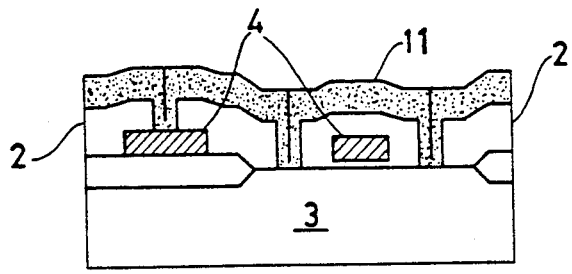
FIGS. 4a-4d are cross-sectional views of further proposed prior art process attempting to solve the problems shown in FIG. 1.
Figure 4B:
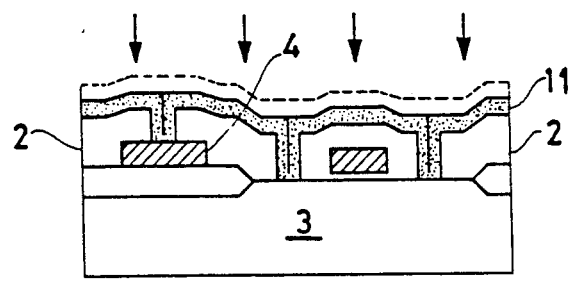

FIGS. 4a-4d illustrate another prior art attempt to deal with the problem of having submicron geometry contact holes. According to this technique, a CVD depositable metallic material 11 is deposited under nonselective conditions (blanket deposition) in order to completely fill the holes formed through the thickness of the isolation dielectric layer 2, as shown in FIG. 4a. According to this blanket deposition technique, it is empirically sufficient to fill the hole to the bottom and form electrical contact if the thickness of the deposited layer 1 is greater than half the width of the hole (the depth of the hole being of a secondary importance). Unfortunately, this leaves a thick metal layer having a poor conductivity, (but good step coverage) on top of the insulating layer 2. Subsequently an anisotropic etching (etchback) is conducted, as shown in FIG. 4b, until the chemically deposited metallic material is left only inside the holes (contacts and interconnection vias). An exhausting description of this second known technique is contained in the article "A STUDY OF TUNGSTEN ETCHBACK FOR CONTACT AND VIA FILL APPLICATIONS" by Jen Jian Lee and Dennis C. Hartman, presented at the IEEE VLSI Multilevel Interconnection Conference (VMIC) of 1987.

Figure 4C:
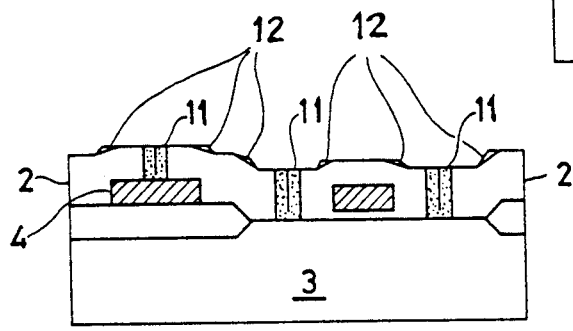
Figure 4D:
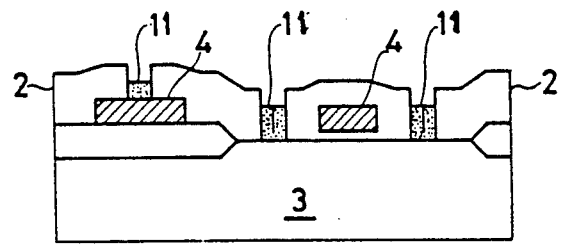

There is the drawback caused by the surface of the dielectric layer 2 not being perfectly flat. Residues 12 of the metallic material 1 with which the contacts and interconnection vias holes have been filled remain all along steps and generally along discontinuities from planarity of the surface of the dielectric layer 2, as shown in FIG. 4c. If this metal residue 12 remains on the insulating layer 2, significant problems are created. The metal residue 12 must be completely removed from the surface of the insulator 2. A complete removal of the metal residue 12 from the surface of the isolation dielectric layer, which could otherwise constitute many shortcircuiting paths, requires an overetching of the metallic material 1 at the end of the etchback process for 30 to 50% of the etch time of the preceding etchback step. However, such an overetching undesirably lowers the level of the peaks of the formed plugs 11, thus worsening the planarity conditions, as shown in FIG. 4d.

Figure 4E:
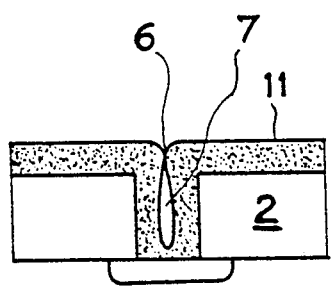
FIG. 4e is a cross-sectional view of one problem created by the proposed prior art solution shown in FIGS. 4a-4d.

FIG. 4e illustrates another problem caused by this prior art technique. The filling of the contact hole by nonselective CVD deposited metal starts from the walls of the contact hole toward the center thereof. In case of contacts having a substantially vertical profile, or worse with a negative profile (i.e. with a certain undercut), this mechanism of growth may lead to an occlusion 6 near the top of the contact hole with the consequence of leaving a cavity 7 inside the contact plug, as depicted in FIG. 4e. During the following overetching step the bottom of the cavity may become exposed to the etch and this may lead to an accidental etching of the underlying junction region. That is, the metal 1 may be etched out from the bottom of the contact holes destroying the electrical contact. This renders the part defective.

There is the need yet for a process for forming contact plugs of a metallic material chemically deposited from vapor phase with improved planarity conditions of the front of the wafer being fabricated.

FIGS. 5a-5g illustrate the process steps carried out according to principles of the present invention. The present invention is applicable to many different processes and can fit into existing techniques for fabricating integrated circuits.

Figure 5A:
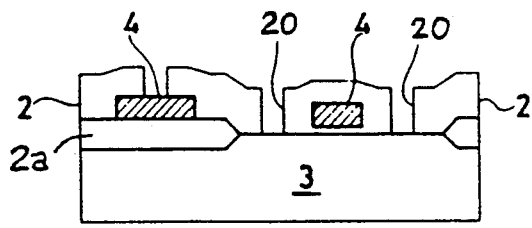
FIGS. 5a-5g are cross-sectional views of a process for making contact plugs according to principles of the present invention.

As illustrated in FIG. 5a, the semiconductor structure includes a substrate 3 having a field oxidation insulating layer 2a formed thereon. One or more insulating layers 2 are also formed on the integrated circuit. One or more conductive layers 4, generally made of polysilicon, are then formed overlaying the insulating layers. As will be appreciated by those of ordinary skill in the art, the integrated circuit may have between one and four polysilicon layers separated by respective dielectric layers 2. Alternatively, the conductive layers 4 may be metallic layers. Contact holes 20 are formed in the dielectric layer to expose the conductive layers 4 and substrate 3. Basically, the fabrication of the integrated circuit may follow any steps selected by the user up to the point of forming electrical contact holes 20 through a dielectric layer 2 to the semiconductor substrate 3 or conductive layers 4, all of which have been previously formed in the process.

A mask, called in the industry a contact mask, is used to define the holes 20 which provide the contact to the conductive layers 4a, 4b in the substrate 3. As is known in the art, the contact holes 20 are formed by lithographic definition of the contact areas utilizing the appropriate contact mask. For example, a layer of photoresist is deposited on the surface of the exposed insulating layer 2. Contact openings are formed through the photoresist and the dielectric layer 2 is etched, usually in a R.I.E. plasma, until the surfaces of the respective layers 3 and 4 to be contacted are exposed. As previously mentioned, the exposed surface may be the surface of the semiconducting substrate 3, a previously formed conducting layer 4 such as a polysilicon layer, or alternatively a previously deposited metallization or silicate layer. Customarily, techniques capable of preventing excessive damage of the contact region of the monocrystalline semiconducting substrate by ion bombardment during the etching of the overlying dielectric layer or capable of removing a superficial portion of the crystalline substrate which may have been so damaged (peeling of the contact surface) may be employed, using techniques known to a skilled technician. FIG. 5a is a microsection of the typical wafer being fabricated, at the end of these manufacturing steps.

Figure 5B:
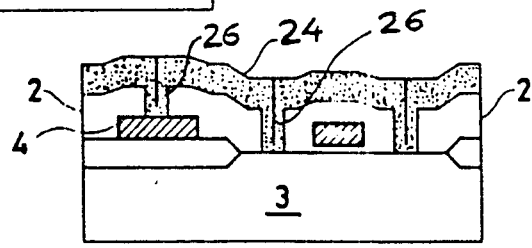

As shown in FIG. 5b, a metallic matrix layer 24, having a thickness sufficient to ensure a complete filling of the contact holes 20 is then formed on the isolation dielectric layer 2. The metallic matrix layer 24 forms an electric contact with the respective exposed surfaces of the conductive layers at the bottom of the holes, including the semiconducting substrate 3 surface or with the surface of the conducting layer 4, as schematically shown in FIG. 5b. The layer 24 is preferably deposited by chemical vapor deposition (CVD); any technique that provides complete coverage and solid electrical contact with the conductive surfaces 3 and 4 is acceptable. The matrix layer 24 may be homogeneous, for example, entirely of tungsten. Alternatively, in order to improve the adhesion characteristics and to reduce the contact resistance and prevent damages to the junctions, the metal matrix layer 24 may comprise a conducting prelayer, also deposited by CVD, of a metallic material belonging to the group composed of titanium alloys, tungsten alloys, titanium, titanium alloy, titanium nitride. Mixtures or multilayers of these materials are alternately arranged among each other in one embodiment. A particularly preferred prelayer may be constituted by a first layer of titanium onto which a second layer of titanium nitride is deposited for a total thickness of 100-150 nm. Over such a prelayer, which may itself be multilayered, a layer of tungsten of a thickness sufficient to completely fill the contact holes 20 may be deposited by CVD. The depositing of the metallic matrix 24 continues until all contact holes 20 are filled, forming contact plugs 26 that establish solid electrical contact between the plug 26 and the surface regions of layers 3 and 4. The metal matrix layer 24 extends completely over the surface of the semiconductor and overlays the insulating layer 2, as can be seen in FIG. 5b. The metallic matrix 24 extends above the insulating layer 2 for a height at least equal to the height necessary to completely fill the contact holes 20. For a 0.8 μm width of contact hole 20 the matrix layer 24 may have a comprehensive total thickness comprised between 0.5 and 0.8 μm.

Figure 5C:
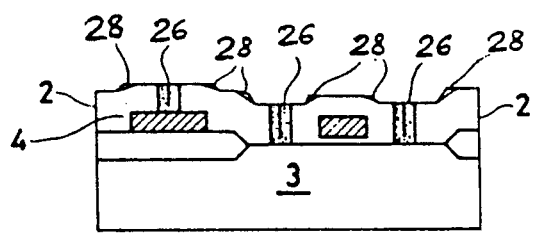

As shown in FIG. 5c, the excess portions of the metal layer 24 are now removed, leaving the contact plugs 26 intact. According to principles of the present invention, process steps are followed which ensure that the contact plugs 26 are left intact, in full electrical contact with the respective conductive layers 3 and 4. In addition, the contact plugs 26 are ensured of being substantially coplanar with the upper surface of the insulating layer 2 that is immediately adjacent the respective contact plug 26.

According to principles of the present invention the matrix layer 24 is completely removed from the surface of the isolation dielectric layer 2 by a series of steps. This may be effected by means of a first R.I.E. plasma anisotropic etchback step, by employing a plasma composition suitable to ensure a certain degree of etch selectivity of the metallic material of the matrix layer 24 as opposed to the dielectric material of the isolation layer 2. The dielectric layer 2 is commonly an amorphous oxide (i.e. a glass), but could be any material including a nitride. A mixture of $SF_6+O_2$ may be advantageously employed for this R.I.E. etchback step until some portions of the surface of the underlying isolation dielectric layer 2 are exposed. The $SF_6+O_2$ mixture is advantageously used on a metal layer 24 of a tungsten alloy or titanium, the appropriate mixture being selected to etch the metal layer 24 to remove it from the insulating layer 2. This first etchback of the filling matrix layer 24 of tungsten may also be conducted as described in the previously cited article "A STUDY OF TUNGSTEN ETCHBACK FOR CONTACT AND VIA FILL APPLICATIONS." In particular, the etchback may be carried out in several steps, for example in a mixture of $SF_6+CBrF_3$ or in a mixture of $SF_6+Ar+Cl_2$, as described in the article, in order to avoid undesirable lowering of the peaks of the tungsten plugs 26 significantly below the plane of the upper surface of insulating layer 2 that is immediately adjacent the respective plugs 26.

Etching of the metal layer 24 continues until the peaks of the tungsten contact plugs 26 are substantially coplanar with the relatively adjacent surface of the isolation dielectric layer 2, as schematically depicted in FIG. 5c. If multilayers of metallic prelayers have been used to form plug 26, the metal layer 24 is etched until the plug 26 is flush with the surface of this metallic prelayer. In one embodiment, the plug 26 may be etched until it is very slightly below the adjacent surface of the insulating layer 2 because the subsequent aluminum covering step can cover very shallow steps.

The time in which to stop the etching may be determined through an analysis of the reaction products effluent from the R.I.E. reactor chamber according to common techniques well-known to a skilled technician given the teachings of this present invention.

As shown in FIG. 5c, when the etching is stopped, residues 28 of the metal 24 are left on top of the insulating layer 2. The insulating layer 2 is not perfectly planar. Inevitably, it will include some valleys, slight depressions, or discontinuities from a perfectly planar surface. The residues 28 of the metal layer 24 remain on the insulator 2 after the etching has stopped. The residue 28 can be located at various, and sometimes random, positions on top of insulating layer 2, thus making it difficult to predict where residue will be left. It is desirable to completely remove all of this residue 28 to ensure that it does not short out circuits or create problems in later steps.

According to principles of the present invention, when the first etchback of the metal layer 24 is stopped, significant pockets of residue 28 remain on insulating layer 2. That is, when the plugs 26 have been etched to be substantially coplanar with the immediately adjacent surface region of the insulating layer 2, some residue metal 28 will be on other portions of the layer 2. A resist is then deposited on top of the insulating layer 2 and masked to provide resist caps 30.

Figure 5D:
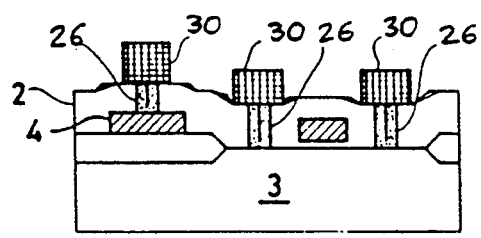

As illustrated in FIG. 5d, resist caps 30 are formed overlying the conductive plugs 26 and overlapping the plugs 26 to overlay at least a portion of the surrounding insulating layer 2. A resist is then deposited over the surface and masked to leave caps over the contact plugs. A resist is selected that is not etched by the etching process used to etch the metal layer (or is etched at a much slower rate than the metal layer). According to one embodiment, the resist caps 30 are formed using a mask which is derived from the contact mask that was used to define the contact holes 20. According the principles of the present invention, the mask for forming the resist caps 30 is obtained by a field inversion, that is, a substantially negative copy, of the contact mask. The caps 30 are thus assured of aligning perfectly with the contact plugs 26. According to one embodiment, during the preparation of the resist mask for caps 30, a slight enlargement of the features is purposely introduced, creating a slight magnification of the features used to produce the contact holes 20. The amount of magnification is selected to correspond to the typical possible misalignment that may be experienced when exposing masks to create features. That is, the alignment tolerance for making semiconductor circuit features (i.e., the contact holes 20) is used to determine the enlargement of the contact mask for making the cap mask. For example, for a 0.8 μm process, enlargement may be in the range of 0.3–0.4 μm. Thus, even there has been some minor misalignment in the forming of the contact holes 20, the enlargement of the mask for forming the caps 30 will be sufficient to correspond to the maximum expected misalignment. Even if some misalignment did occur, the resist cap 30 will completely cover the plug 26 with at least a slight amount of overlap onto the insulating layer 2. Using the inverse of the contact mask for the mask resist caps 30 provides the advantage of effective self-alignment of the resist caps 30 exactly with the contact plugs 26. (The features shown in FIGS. 5a–5g are not exactly to scale. Some features have been enlarged, such as the overlap of caps 30, to clearly illustrate them, while other features are relatively smaller than shown.)

By employing this additional mask, derived from the contact mask, for exposing the resist, a perfect masking of the tungsten peaks of the plugs 26, coplanar with the surface of the dielectric layer 2 adjacent thereto (or with the surface of the prelayer if the same exists), with caps 30 of resist is achieved, as schematically depicted in FIG. 5d.

After having so masked the peaks of the contact plugs 26 means of resist caps 30, an overetching of the layer 24 is performed to completely remove residues 28. Conditions for removing residue 28 can be similar to those employed on the previous etchback. In an alternative embodiment, the etching conditions were modified so as to reduce the anisotropy of the etching and increase the selectivity with respect to the dielectric material (oxide) forming the isolation layer 2. That is, an etch mixture and pressure having reduced anisotrophy and an increased etch rate of the metal layer 24 that formed the residues 28 versus the etch rate of the dielectric material of layer 2. To this end, it is useful to conduct this second etchback for eliminating the residues 28 in a mixture of $SF_6+Cl_2+Ar$ and/or by reducing the pressure in respect to the first etchback step. This second masked etching step is carried out until a complete removal of tungsten residues 28 is achieved and may be eventually continued until complete removal also of any underlying metallic material of an eventual adhesion prelayer is ensured. Because the caps 30 are present and the etch is very selective to etch metal residues 28, the etch can be a significant overetch. That is, the etch can continue for 40 to 60% longer than the expected necessary time to ensure that all residues 28 are removed, regardless of their thickness. Changing to an etch mixture which is more selective for metal 24 is helpful in permitting this overetching without removing excess dielectric layer 2.

Figure 5E:
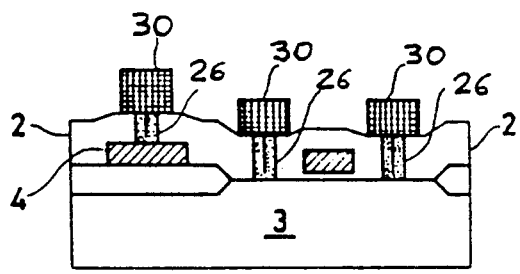

FIG. 5e illustrates the structure at the end of this masked overetching step of the tungsten and of the eventual adhesion metallic prelayer, if the latter is present. Where an adhesion prelayer constituted by a first titanium layer and a second layer of titanium nitride for a total thickness of about 100–150 nm has been formed, this multilayered prelayer may be easily removed, after having removed all the tungsten residues, by continuing the etching in a $Cl_2$ plasma until a complete removal of the prelayer material of the matrix layer. At all times, the cap 30 protects the plugs 26. A resist for the resist cap 5 is selected which is not etched by a mixture which etches the metal layer 24.

Figure 5F:
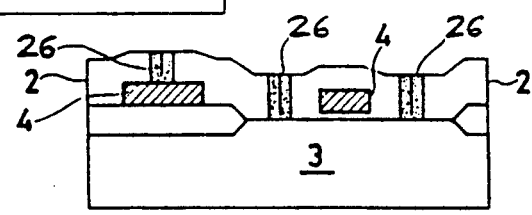

As shown in FIG. 5f, the resist cap 30 is then removed, leaving the wafer with a complete elimination of metallic residues 28 on the surface of the isolation dielectric layer 2. A clean surface of layer 2 has been obtained without lowering the tungsten peaks of the contact plugs 26 below the level of the surface of the isolation dielectric layer 2. An advantage of the present invention is that it ensures a perfect uniformity of the relative level of the peaks of the contacts and of the interconnection vias. The improved "coplanarity" conditions decisively improve the conditions for the subsequent deposition and definition of tracks of a highly conducting metallic material and for the further layers to be formed thereon, with positive reflexes on the yield and reliability of the process.

The removal of an adhesion prelayer of a material different from the tungsten filling 24 used for the contact plugs 26 may also be arrested after having ensured the removal of all the tungsten residues, thus leaving the prelayer material on the surface of the dielectric. The removal of this prelayer can take place at the end of a definition etching step of a subsequently deposited metallization layer which may be of aluminum or aluminum alloy or of copper or copper alloy or constituted by a multilayer of aluminum and refractory metals such as titanium and tungsten, for forming conducting tracks connecting the contact and/or via plugs over the dielectric isolation layer.

Figure 5G:
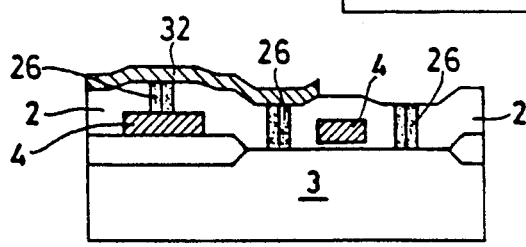

As shown in FIG. 5g, a highly conductive metallic material 32 is appropriately deposited and etched in selective contact with selected plugs 26 to provide the desired circuit and interconnections thereof. The metal layer 32 is ensured of having complete electrical contact with each contact plug 26 and the plug 26 with the surface of the conductive layer 4 or 3, as desired. Of course, the same metal strip 32 may be in contact with all plugs 26 shown, or with only one of the plugs 26, depending on the electrical connections derived for the circuit.

We claim:

1. A process for forming contacts with a semiconducting substrate and/or interconnection vias between a first conducting layer and a second conducting layer to be formed at a higher level than said first conducting layer, comprising forming conducting plugs of a metallic material by filling contact and/or via holes, formed through an isolation layer of dielectric material formed over said semiconducting substrate and/or over said first conducting layer, by chemical vapor deposition of a metallic matrix layer comprising at least a filling layer of a first metallic material chemically deposited from vapor phase, and etchingback said chemically deposited matrix layer for removing it from the surface of said isolation layer of dielectric material while leaving said conducting plugs in the respective holes, characterized by the fact that the removal of said chemically deposited metallic matrix layer from the surface of said isolation layer of dielectric material is performed by the following steps:

anisotropically etching back said filling layer of said chemically deposited first metallic material until exposing the surface of the underlying dielectric material onto which said first metallic material has been deposited while leaving residues of said filling first metallic material within said holes and along other discontinuities from planarity of said surface;

masking the peaks of said filling first metallic material of said conducting plugs;

overetching said first metallic material for eliminating residues thereof present on the unmasked surface of said underlying dielectric material.

2. The process according to claim 1, wherein said overetch is conducted under conditions of reduced anisotropy and increased etch selectivity of said first metallic material of said matrix layer versus said dielectric material of said insulation layer, in respect to said first etchback step.

3. The process according to claim 1, wherein the masking of the peaks of said conducting plugs is performed by depositing a layer of resist on said exposed surface, exposing the resist through a substantially field-inverted mask in respect to a mask employed for defining said holes formed through said isolation layer of dielectric material and derived from the latter mask by field inversion and enlargement of the mask profiles by a quantity equal to the typical misalignment of the exposition apparatus used for exposing the resist.

4. The process according to claim 1, wherein said chemically deposited from vapor phase first metallic material is tungsten.

5. The process according to claim 4, wherein said matrix layer is constituted by at least a prelayer, chemically deposited from vapor phase directly on the contact surfaces of said semiconducting substrate and/or said first conducting layer at the bottom of said holes, of a metallic material different from tungsten and selected from the group composed of titanium, titanium and tungsten alloy, titanium nitride and mixtures or multilayers thereof and by a filling layer of tungsten, chemically deposited from vapor phase.

6. The process according to claim 1, wherein said first etchback is performed by R.I.E. conducted in a plasma of a mixture of $SF_6$ and $O_2$.

7. The process according to claim 5, wherein said first etchback of tungsten is performed by R.I.E. conducted in a plasma of a mixture selected from the group of mixtures composed of $SF_6+CBrF_3$, $SF_6+Cl_2+Ar$ and $SF_6+O_2$ and said overetch is performed by R.I.E. conducted in a plasma selected from the group composed of $SF_6+Cl_2+Ar$ and $Cl_2$.

8. The process according to claim 7, wherein said overetch is continued until a complete removal of the material of said prelayer from the unmasked surface of said isolation layer of dielectric material.

9. A method of forming electrical contact between a metal layer overlying a dielectic layer and a conductive region in a layer below said dielectric layer comprising:

forming a dielectric layer over a conductive layer region;

forming contact holes in said dielectric layer, said contact holes having an opening that exposes said conductive region in the layer below said dielectric layer;

depositing a layer of conductive material overlying said dielectric layer and completely filling said contact holes to provide contact plugs having complete electrical contact between said exposed conductive region below said dielectric layer and said conductive layer;

etching a portion of said conductive material from said dielectric layer, said etching continuing until the contact plugs are generally coplanar with the dielectric layer immediately adjacent said respective contact plugs, but said etching leaving residues of conductive material on top of said dielectric layer;

forming a layer of resist overlying the exposed dielectric layers' surface region, including overlying said dielectric layer itself, said residues of conductive material on top of said dielectric layer, and said contact plugs;

selectively etching said resist to leave resist caps overlying said contact plugs and remove said resist from other portions of said dielectric layer such that said residues are exposed;

etching said conductive material a second time, said etching of a second time being effective to remove said exposed residues of said conductive layer, said etching continuing until all of said residues are completely removed; and removing said resist caps to expose an upper surface of said contact plugs, said contact plugs being in electric contact with said conductive region below said dielectric layer and said contact plugs being generally coplanar with the dielectric layer immediately adjacent said respective contact plugs after said etching step.

10. The method according to claim 9 further including the steps of:

depositing a metallic layer on top of said dielectric layer after said second etching have been performed;

selectively etching said metallic layer to form electrical contact with said exposed contact plugs, said metallic layer being in electrical contact with said conductive region below said dielectric layer via said contact plugs to form a desired electrical circuit.

11. The method according to claim 9 wherein said first etching step is conducted using a first etching agent and said second etching step is conducted with a second etching agent, said second etching being different than said first etching agent and said second etching agent being more selective to etch said conductive layer rather than said dielectric layer than said first etching agent.

12. The method according to claim 9 wherein said second etching step is carried out at a lower pressure than said first etching step.

13. The method according to claim 9 wherein said step of selectively etching said resist includes the steps of:

exposing said resist with a resist cap mask in place to form a pattern on said resist, said mask being formed using a contact hole mask that was used to form said contact holes in said dielectric layer.

14. The method according to claim 13 wherein said resist cap mask is a slightly magnified negative of said contact hole mask.

15. The method according to claim 14 wherein the amount of magnification is selected to equal the possible error is alignment of said contact hole mask in forming said contact holes such that said resist caps are assured of being sufficiently large to completely cover said contact plugs, even if a slightly misalignment occurred in forming said contact holes.

16. The method according to claim 11 wherein said second etching agent is selected to not etch said resist caps but to etch said residues.

* * * * *

UNITED STATES PATENT AND TRADEMARK OFFICE
CERTIFICATE OF CORRECTION

PATENT NO. : 5,231,051
DATED : July 27, 1993
INVENTOR(S) : Livio Baldi and Pietro Erratico It is certified that error appears in the above-identified patent and that said Letters Patent is hereby corrected as shown below:

In column 11, claim 9, line 10, after "said" and before "etching", please insert --second--.

Signed and Sealed this

Fifteenth Day of March, 1994

Attest:

BRUCE LEHMAN

Attesting Officer

Commissioner of Patents and Trademarks